United States Patent
Ju

(10) Patent No.: US 10,276,952 B2
(45) Date of Patent: Apr. 30, 2019

(54) ELECTRICAL CONNECTOR AND MANUFACTURING METHOD THEREOF

(71) Applicant: LOTES CO., LTD., Keelung (TW)

(72) Inventor: Ted Ju, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/936,758

(22) Filed: Mar. 27, 2018

(65) Prior Publication Data

US 2018/0316102 A1 Nov. 1, 2018

(30) Foreign Application Priority Data

Apr. 28, 2017 (CN) .......................... 2017 1 0293350
May 9, 2017 (CN) .......................... 2017 1 0320835

(51) Int. Cl.
| | | |
|---|---|---|
| H01R 12/00 | (2006.01) | |
| H01R 13/6581 | (2011.01) | |
| H01R 12/71 | (2011.01) | |
| H01R 4/64 | (2006.01) | |
| H01R 13/6591 | (2011.01) | |
| H01L 33/62 | (2010.01) | |
| H01R 12/70 | (2011.01) | |
| H05K 3/34 | (2006.01) | |
| H05K 7/10 | (2006.01) | |

(52) U.S. Cl.
CPC .............. *H01R 12/00* (2013.01); *H01L 33/62* (2013.01); *H01R 4/64* (2013.01); *H01R 9/093* (2013.01); *H01R 12/7076* (2013.01); *H01R 12/712* (2013.01); *H01R 13/6581* (2013.01); *H01R 13/6591* (2013.01); *H05K 3/3436* (2013.01); *H05K 7/1084* (2013.01); *H01R 12/707* (2013.01)

(58) Field of Classification Search
CPC .............. H01R 23/722; H01R 13/2414; H01R 13/2442; H05K 7/1069
USPC ............................. 439/66, 68, 91, 591, 862
See application file for complete search history.

(56) References Cited

U.S. PATENT DOCUMENTS 5,462,440 A * 10/1995 Rothenberger ........ H01R 43/24
439/591
6,669,490 B1 * 12/2003 DelPrete et al. ....... H01R 12/52
439/66

(Continued)

FOREIGN PATENT DOCUMENTS

| CN | 202067956 U | 12/2011 |
|---|---|---|
| CN | 203707383 U | 7/2014 |

*Primary Examiner* — Thanh Tam T Le
(74) *Attorney, Agent, or Firm* — Locke Lord LLP; Tim Tingkang Xia, Esq.

(57) ABSTRACT

An electrical connector, used for being electrically connected with a chip module, includes a body, at least one protruding portion, a metal layer, and a plurality of terminals. The body is provided with a plurality of accommodating holes, and has an upper surface. The protruding portion protrudes upward from the upper surface, and an insulating portion is located on the protruding portion to support the chip module. The metal layer covers the upper surface and a periphery of the at least one protruding portion, and a portion of the metal layer located on the periphery of the at least one protruding portion is higher than a portion of the metal layer located on the upper surface. The terminals are accommodated in the accommodating holes and used to be conductively connected with the chip module.

19 Claims, 12 Drawing Sheets

(56) References Cited

U.S. PATENT DOCUMENTS

| | | | | | |
|---|---|---|---|---|---|
| 6,897,568 B2* | 5/2005 | Haimerl | ............... | H01L 24/10 | |
| | | | | | 257/779 |
| 7,322,829 B2* | 1/2008 | Ma | ............... | H01R 13/2442 | |
| | | | | | 439/66 |
| 7,887,336 B2* | 2/2011 | Nikaido | ............ | H01L 23/49827 | |
| | | | | | 439/66 |
| 7,972,144 B2* | 7/2011 | Chang | ............... | H01R 4/02 | |
| | | | | | 439/66 |
| 8,137,113 B2* | 3/2012 | Ouchi | ............... | H05K 3/326 | |
| | | | | | 439/66 |
| 8,277,230 B2* | 10/2012 | Huo | ............... | H01R 12/716 | |
| | | | | | 439/342 |
| 8,968,007 B2* | 3/2015 | Kuwahara | ............ | H01R 12/714 | |
| | | | | | 439/66 |

\* cited by examiner

S1: provide a body having an upper surface, where at least one protruding portion protrudes upward from the upper surface and is configured to support a chip module

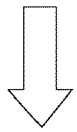

S2: provide a metal layer plated on the upper surface and all surfaces of the at least one protruding portion

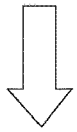

S3: insulate a top surface of the at least one protruding portion

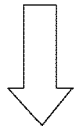

S4: assemble a plurality of terminals in the body

FIG. 6

ELECTRICAL CONNECTOR AND MANUFACTURING METHOD THEREOF

CROSS-REFERENCE TO RELATED PATENT APPLICATION

This non-provisional application claims priority to and the benefit of, under 35 U.S.C. § 119(a), patent application Serial No. CN201710293350.5 filed in China on Apr. 28, 2017 and patent application Serial No. CN201710320835.9 filed in China on May 9, 2017. The disclosures of the above applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector and a manufacturing method thereof, and in particular to an electrical connector with a shielding effect and a manufacturing method thereof.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

With rapid development of the computer technology, the number of terminals of an LGA electrical connector is increasing. Thus, the terminals are arranged densely, so that signal interference among the terminals is prone to occurring. To shield the signal interference among the terminals, the industry usually uses an electrical connector for electrically connecting a chip module to a circuit board, which includes a body, and multiple protruding blocks are integrally formed on the body for supporting the chip module. The body is provided with multiple signal accommodating grooves and multiple ground accommodating grooves, and multiple signal terminals and multiple ground terminals are correspondingly accommodated in the signal accommodating grooves and the ground accommodating grooves. An upper surface of the body is plated with a metal layer which is used for shielding the signal interference among the signal terminals.

However, when the upper surface of the body is plated with the metal layer, the surfaces of the protruding blocks are also plated with the metal layer. Therefore, when the chip module is supported on the protruding blocks, portions of the metal layer located on the top surfaces of the protruding blocks are in contact with the chip module, thus causing short-circuiting of the chip module.

Therefore, a heretofore unaddressed need to design an improved electrical connector exists in the art to address the aforementioned deficiencies and inadequacies.

SUMMARY

In view of the aforementioned deficiencies in the related art, the present invention is directed to an electrical connector which has a shielding effect and can prevent a chip module from short-circuiting.

To achieve the foregoing objective, the present invention adopts the following technical solutions: an electrical connector, configured to be electrically connected with a chip module, includes: a body, provided with a plurality of accommodating holes, and having an upper surface; at least one protruding portion protruding upward from the upper surface, wherein an insulating portion is located on the at least one protruding portion to support the chip module; a metal layer covering the upper surface and a periphery of the at least one protruding portion, wherein a portion of the metal layer located on the periphery of the at least one protruding portion is higher than a portion of the metal layer located on the upper surface; and a plurality of terminals, accommodated in the accommodating holes and configured to be conductively connected with the chip module.

In certain embodiments, each of the at least one protruding portion is provided with a first side surface, a second side surface, and two third side surfaces opposite to each other; the first side surface and the second side surface are oblique and configured to connect the two third side surfaces; each of the third side surfaces is perpendicular to the upper surface; and an acute angle formed between the first side surface and the upper surface is smaller than an acute angle formed between the second side surface and the upper surface.

In certain embodiments, each of the terminals has a fixing portion being oblique and configured to fix the terminal to the body, and an inclined angle of the fixing portion relative to the upper surface is identical to the acute angle formed between the second side surface and the upper surface.

In certain embodiments, the second side surface of each of the at least one protruding portion and an inner wall of a corresponding one of the accommodating holes are coplanar.

In certain embodiments, each of the terminals has an elastic portion being oblique and configured to abut the chip module, and an inclined angle of a top of the elastic portion relative to the upper surface is identical to the acute angle formed between the first side surface and the upper surface.

In certain embodiments, the first side surface of each of the at least one protruding portion and an inner wall of a corresponding one of the accommodating holes are spaced apart.

In certain embodiments, the insulating portion integrally extend from the at least one protruding portion.

In certain embodiments, each of the at least one protruding portion is step-shaped having a smaller top and a larger bottom, and a top surface of the insulating portion is a flat surface.

In certain embodiments, a top surface of the insulating portion is an arc-shaped surface.

In certain embodiments, the insulating portion is mounted on a top surface of the at least one protruding portion, and the metal layer covers the top surface of the at least one protruding portion.

In certain embodiments, the terminals include a plurality of signal terminals and a plurality of ground terminals, and each of the signal terminals and the ground terminals has a fixing portion; the body has a plurality of first slots and a plurality of second slots; each of the first slots fixes the fixing portion of a corresponding one of the signal terminals and each of the second slots fixes the fixing portion of a corresponding one of the ground terminals; the second slots penetrate through the upper surface, so that the metal layer covers an inner wall of each of the second slots, and the fixing portion of each of the ground terminals is in contact with the metal layer; and the first slots do not penetrate through the upper surface, so that the metal layer does not cover inner walls of the first slots.

In certain embodiments, each of the terminals has an elastic portion being oblique toward a same side and configured to abut the chip module, and a fixing portion configured to fix the terminal; a beam is provided to connect the elastic portion and the fixing portion; and an inclined angle of the fixing portion and an inclined angle of the elastic portion are different.

In certain embodiments, the accommodating holes are arranged in a plurality of rows and columns, and each of the at least one protruding portion is located between two adjacent ones of accommodating holes along a row direction and a column direction.

A manufacturing method of the electrical connector includes: S1: providing a body having an upper surface, wherein at least one protruding portion protrudes upward from the upper surface and is configured to support a chip module; S2: providing a metal layer plated on the upper surface and all surfaces of the at least one protruding portion; S3: insulating a top surface of the at least one protruding portion; and S4: assembling a plurality of terminals in the body.

In certain embodiments, the step of insulating the top surface of the at least one protruding portion includes: inversely disposing the body in a chemical fluid, so that the top surface of the at least one protruding portion is immersed in the chemical fluid, until a portion of the metal layer located on the top surface of the at least one protruding portion is completely removed.

In certain embodiments, the step of insulating the top surface of the at least one protruding portion includes: providing an insulating portion, mounted on the top surface of the at least one protruding portion.

In certain embodiments, the step of insulating the top surface of the at least one protruding portion includes: focusing a laser on the top surface of the at least one protruding portion to perform burning, until a portion of the metal layer located on the top surface of the at least one protruding portion is completely burnt up.

In certain embodiments, before the burning of the laser, a protruding block is provided on the top surface of the at least one protruding portion to allow the laser to focus thereon, an area of the protruding block is smaller than an area of the top surface of the at least one protruding portion, and the protruding block disappears after the burning of the laser.

In certain embodiments, in the step S2, a metal fluid is poured onto the upper surface from top to bottom, so that the metal fluid freely diffuses on the upper surface until the upper surface is entirely covered, thereby plating the metal layer on the upper surface.

Compared with the related art, certain embodiments of the present invention has the following beneficial effects:

The metal layer covers the upper surface and a periphery of the at least one protruding portion, and insulating portion is located on the protruding portion to support the chip module, thus ensuring the metal layer to better shield signal interference among the terminals, satisfying high-frequency signal transmission of the terminals, and avoiding the metal layer from contacting with the chip module and preventing the chip module from short-circuiting.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein:

FIG. 6 is a flowchart of a manufacturing method of the electrical connector according to certain embodiments of the present invention.

DETAILED DESCRIPTION

Figure 1:
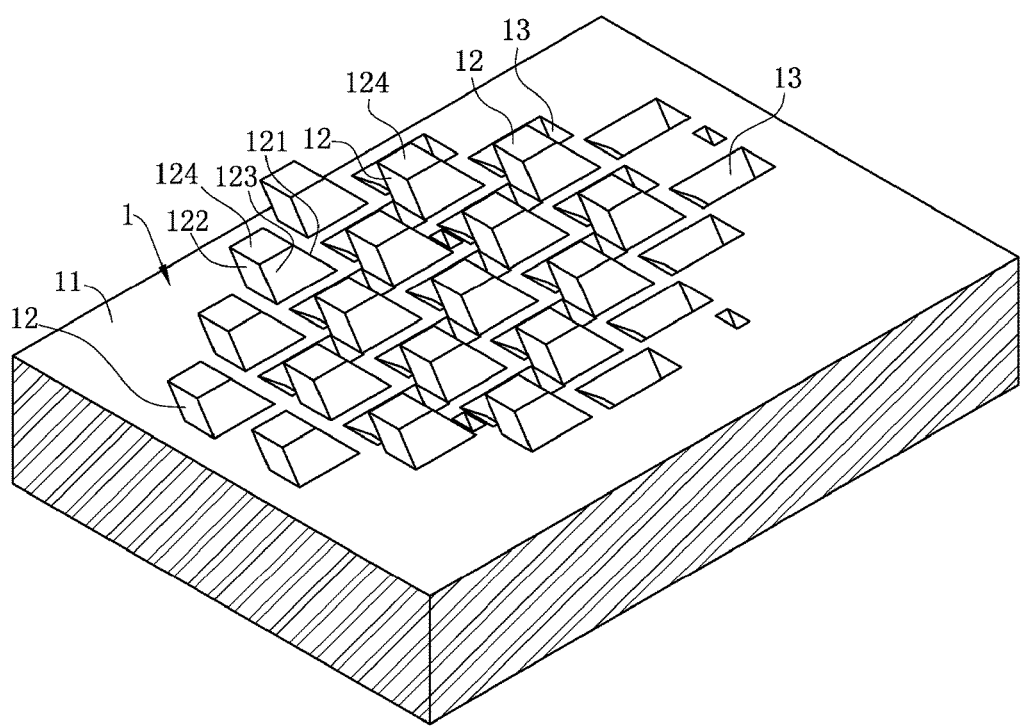
FIG. 1 is a perspective schematic view of an electrical connector according to a first embodiment of the present invention before a body thereof is plated with a metal layer.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in"

includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-12. In accordance with the purposes of this invention, as embodied and broadly described herein, this invention, in one aspect, relates to an electrical connector and a manufacturing method thereof.

Figure 3:
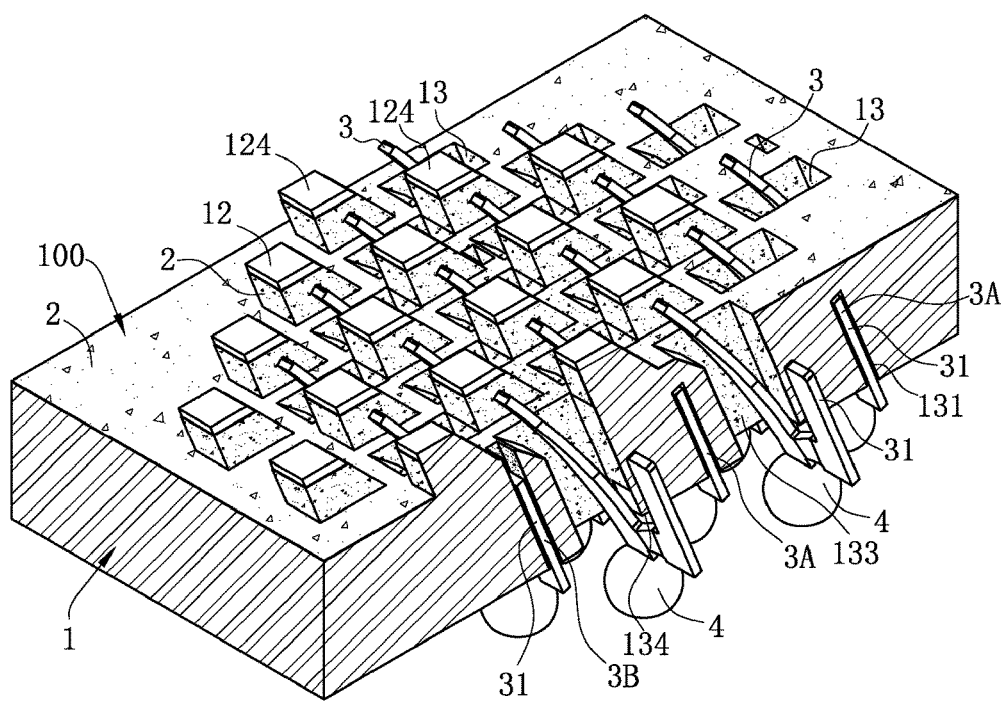
FIG. 3 is a local perspective assembled schematic view of the electrical connector according to the first embodiment of the present invention.
Figure 4:
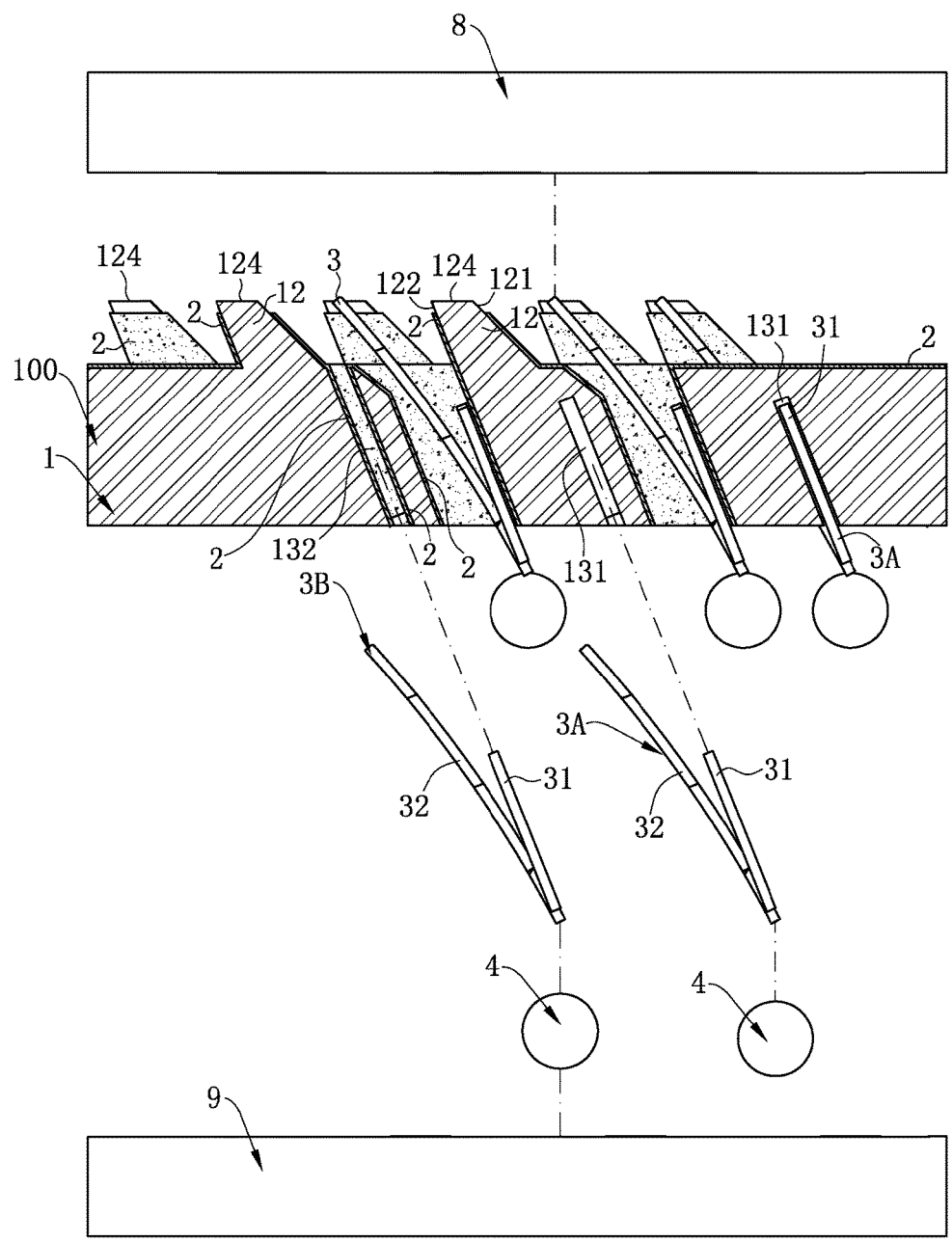
FIG. 4 is a sectional view of the electrical connector according to the first embodiment of the present invention before a chip module and a circuit board are assembled.
Figure 5:
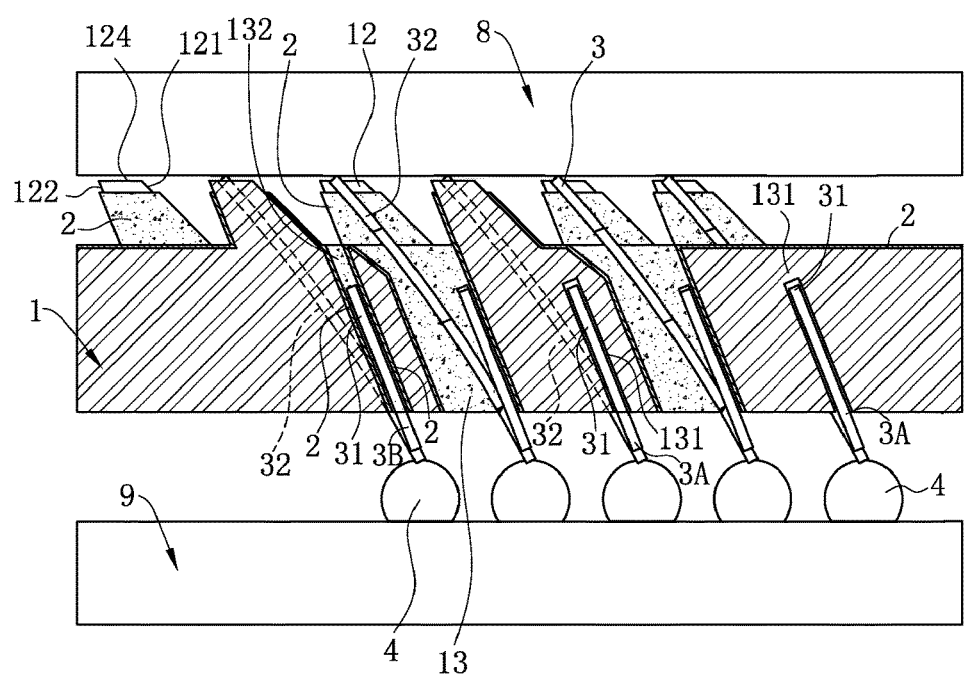
FIG. 5 is a sectional view of the electrical connector according to the first embodiment of the present invention after the chip module and the circuit board are assembled.

FIG. 1, FIG. 3 and FIG. 5 show an electrical connector 100 according to the first embodiment of the present invention. The electrical connector 100 is used for electrically connecting a chip module 8 to a circuit board 9, which includes a body 1, and the body 1 is provided with a plurality of accommodating holes 13 arranged in a plurality of rows and columns. Multiple terminals 3 are inserted into the corresponding accommodating holes 13 from bottom to top correspondingly. One end of each terminal 3 abuts the chip module 8, and the other end of each terminal 3 is soldered to the circuit board 9 through a solder ball 4. A metal layer 2 is plated on the insulating body 1.

Figure 2:
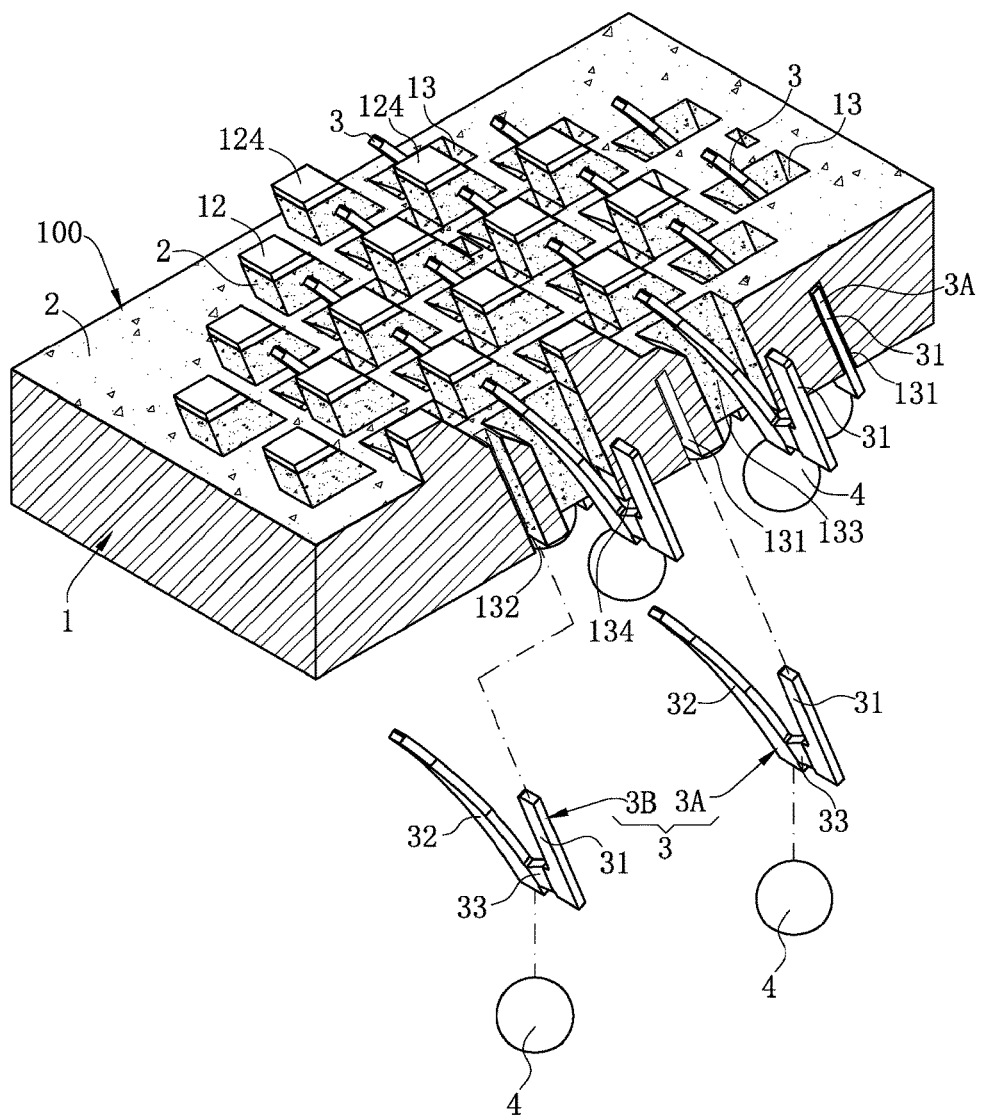
FIG. 2 is a local perspective exploded schematic view of the electrical connector according to the first embodiment of the present invention.

As shown in FIG. 2 and FIG. 3, the terminals 3 include multiple signal terminals 3A and multiple ground terminals 3B, and the signal terminals 3A and the ground terminals 3B are of the same structure. Each terminal 3 has a beam 33. An elastic portion 31 is formed by extending upward obliquely from one side of the beam 33, and a top end of the elastic portion 31 elastically abuts the chip module 8. A fixing portion 32 is formed by extending upward obliquely from an opposite side of the beam 33, and the fixing portion 32 is fixed into a corresponding accommodating hole 13. An inclined angle of the fixing portion is different from an inclined angle of the elastic portion 31.

As shown in FIG. 1, FIG. 2 and FIG. 5, the body 1 has an upper surface 11, and the upper surface 11 is protrudingly formed with a plurality of protruding portions 12 extending upward. Each protruding portion 12 is located between the two corresponding adjacent accommodating holes 13 along the row direction and the column direction. The metal layer 2 covers the upper surface 11 and peripheries of the protruding portions 12, and portions of the metal layer 2 located on the peripheries of the protruding portions 12 are higher than a portion of the metal layer 2 located on the upper surface 11. An insulating portion 124 is formed on the top surface of each protruding portion 12 to support the chip module 8, thus ensuring the metal layer 2 to shield signal interference among the signal terminals 3A, satisfying high-frequency signal transmission of the signal terminals 3A, and avoiding the metal layer 2 from contacting with the chip module 8 and preventing the chip module 8 from short-circuiting. Further, each protruding portion 12 is provided with a first side surface 121, a second side surface 122, and two third side surfaces 123 opposite to each other. The first side surface 121 and the second side surface 122 are oblique and configured to connect the two third side surfaces 123. Each of the third side surfaces 123 is perpendicular to the upper surface 11. An acute angle formed between the first side surface 121 and the upper surface 11 is smaller than an acute angle formed between the second side surface 122 and the upper surface 11. An inclined angle of a top of the elastic portion 31 relative to the upper surface 11 is identical to the acute angle formed between the first side surface 121 and the upper surface 11, and an inclined angle of the fixing portion 32 relative to the upper surface 11 is identical to the acute angle formed between the second side surface 122 and the upper surface 11. Thus, the inclination of the protruding portions 12, the elastic portions 31 and the fixing portions 32 are guaranteed to be consistent, and interference of the protruding portions 12 and the corresponding terminals 3 can be avoided. In addition, the first side surface 121 of each protruding portion 12 and an inner wall of a corresponding accommodating hole 13 are spaced apart, thus increasing a distance between the first side surface 121 and the corresponding elastic portion 31, preventing the elastic portion 31 from deforming downward and contacting with the first side surface 121 when the chip module 8 is mounted. The second side surface 122 of each protruding portion 12 and an inner wall of a corresponding accommodating hole 13 are coplanar, so that the upper surface 11 can accommodate the protruding portions 12, which may be made larger. Each accommodating hole 13 includes a through slot 133 for accommodating the elastic portion 31 of a corresponding terminal 3. An inner wall of the through slot 133 is also plated with the metal layer 2, and a gap exists between the elastic portion 31 and the metal layer 2, so that the elastic portion 31 is not in contact with the metal layer 2. A position limiting slot 134 is in communication with the through slot 133 correspondingly. The beam 33 is accommodated in the position limiting slot 134, and a top wall of the position limiting slot 134 prevent the beam 33 from moving upward.

As shown in FIG. 2 and FIG. 3, the body 1 has multiple first slots 131 fixing the fixing portions 32 of the signal terminals 3A and multiple second slots 132 fixing the fixing portions 32 of the ground terminals 3B. The second slots 132 penetrate through the upper surface 11, so that the metal layer 2 covers inner walls of the second slots 132, allowing the ground terminals 3B to be conductively connected with the metal layer 2, and enhancing a shielding function of the ground terminals 3B. The first slots 131 do not penetrate through the upper surface 11, so that the metal layer 2 does not cover inner walls of the first slots 131, thus preventing from short-circuiting between the signal terminals 3A and the metal layer 2.

Figure 7:
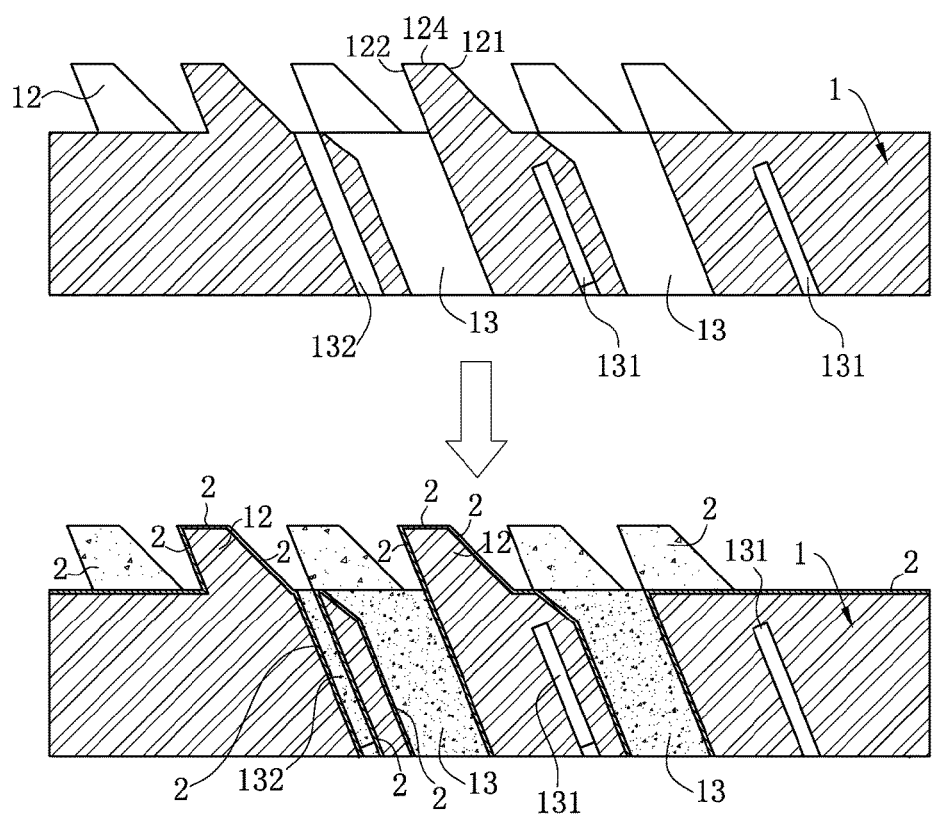
FIG. 7 is a flow schematic view of the electrical connector according to the first embodiment of the present invention before and after the body is plated with the metal layer.
Figure 8:
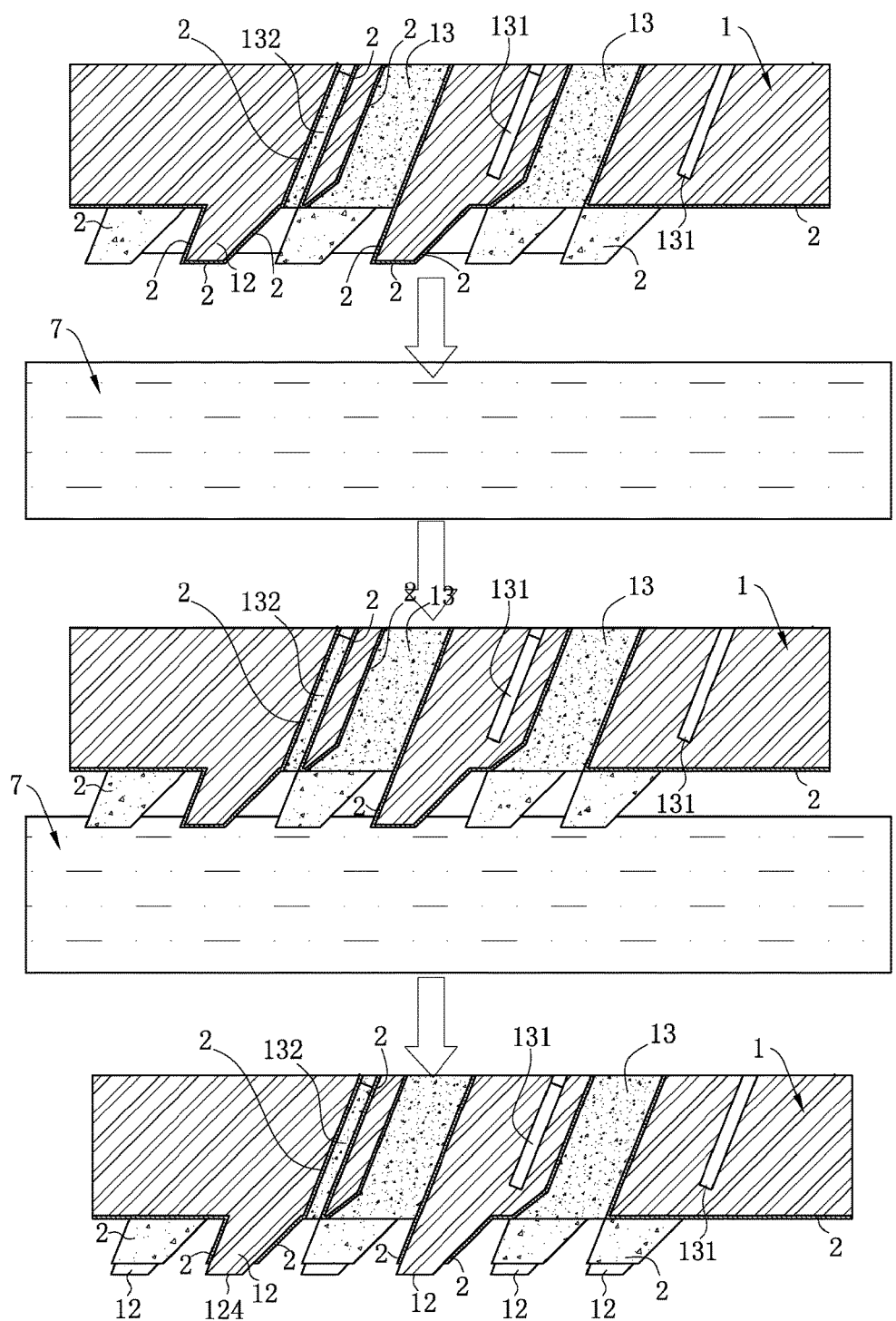
FIG. 8 is a flow schematic view of a first method for insulating the top surfaces of protruding portions of the electrical connector according to the first embodiment of the present invention.
Figure 9:
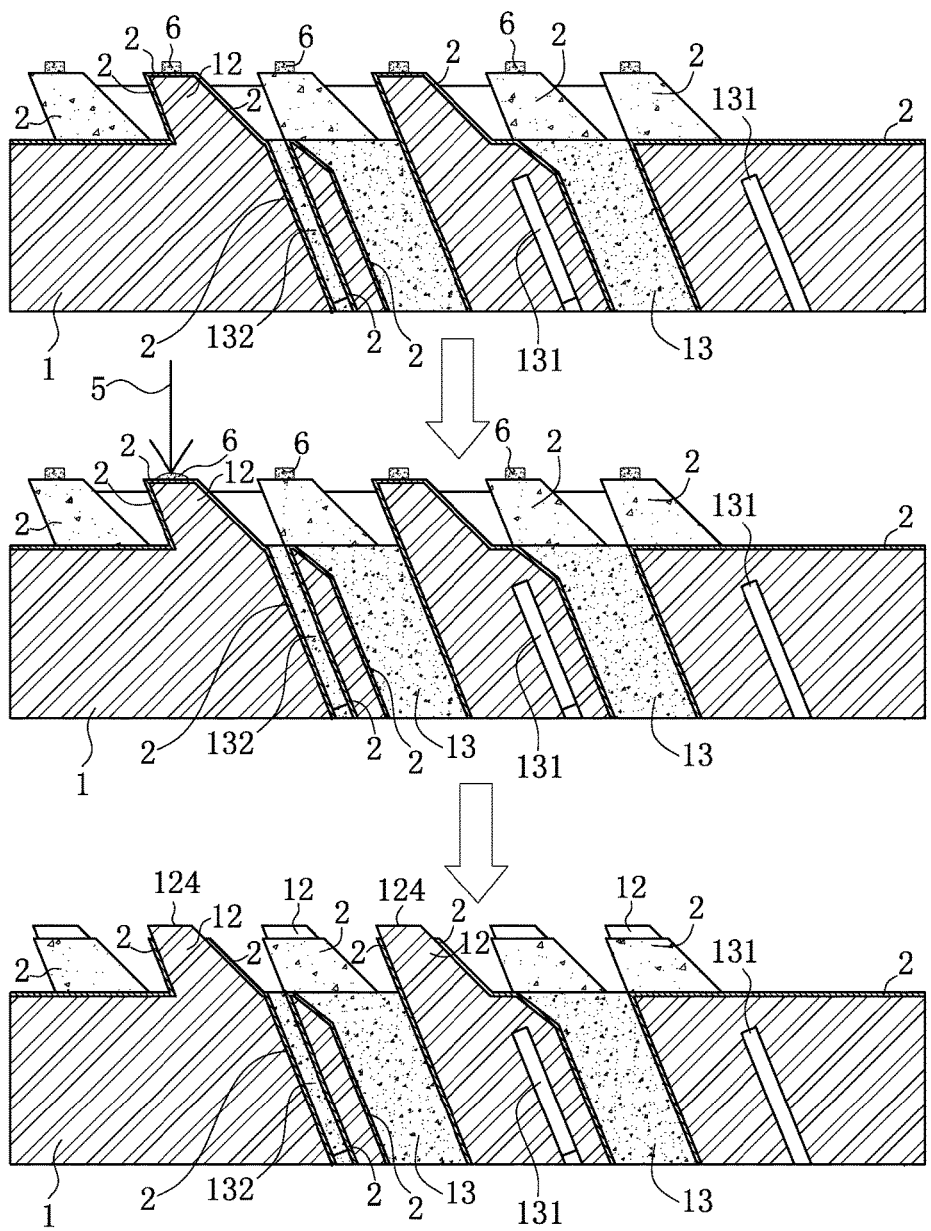
FIG. 9 is a flow schematic view of a second method for insulating the top surfaces of the protruding portions of the electrical connector according to the first embodiment of the present invention.
Figure 10:
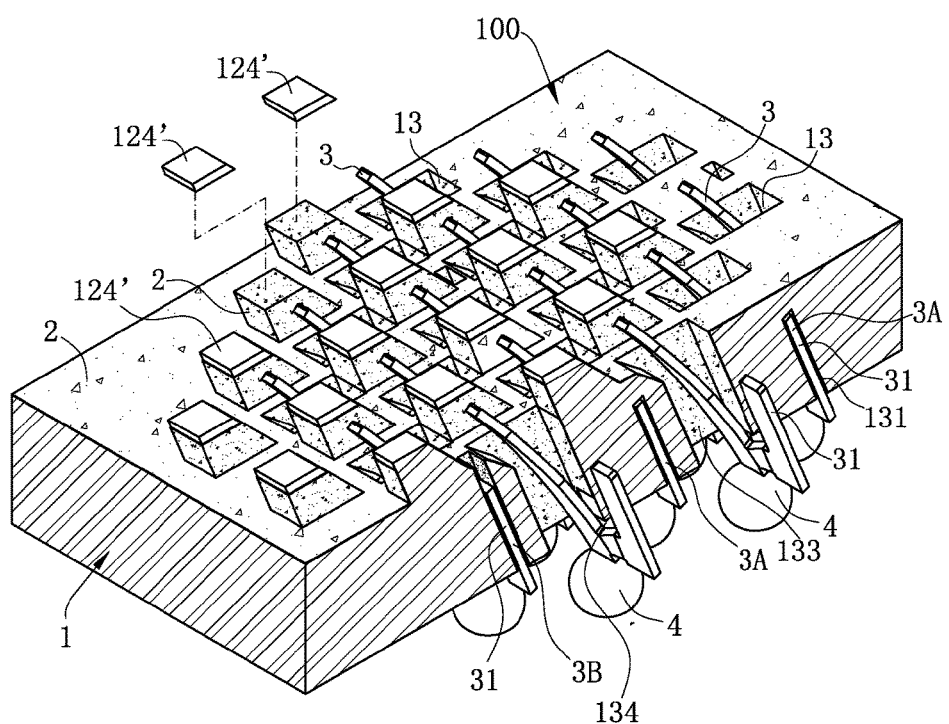
FIG. 10 is a perspective schematic view of an electrical connector according to a second embodiment of the present invention.

As shown in FIG. 6, a manufacturing method of the electrical connector 100 according to certain embodiments of the present invention includes the following steps. In step S1, a body 1 is provided, where the body 1 has an upper surface 11, and at least one protruding portion 12 protrudes upward from the upper surface 11 and is configured to support a chip module 8. In step S2, a metal layer 2 is provided and plated on the upper surface 11 and all surfaces of the at least one protruding portion 12. Preferably, as shown in FIG. 7, a metal fluid is poured onto the upper surface 11 from top to bottom, so that the metal fluid freely diffuses on the upper surface 11, until the upper surface 11 and the protruding portion 12 are entirely covered. Meanwhile, the metal fluid also flows into the accommodating holes 13, thereby plating the metal layer 2 on the inner walls of the accommodating holes 13. In step S3, a top surface of each protruding portion 12 is insulated. In step S4, a plurality of terminals 3 are assembled in the body 1 from bottom to top. It should be particularly noted that, in the step S3, various methods for insulating the top surfaces of the protruding portions 12 can be used, and three methods are listed as follows. In a first method as shown in FIG. 8, the body 1 is inversely disposed in a chemical fluid 7, so that the top surfaces of the protruding portions 12 are immersed into the chemical fluid 7, until portions of the metal layer 2 located on the top surfaces of the protruding portions 12 are completely removed. In this embodiment, the chemical fluid 7 is an acid solution, and in particular, can be any of oxidizing acid solutions such as sulfuric acid and nitric acid. In other embodiments, the chemical fluid 7 can be any other ingredients, as long as the chemical fluid 7 can etch away the portions of the metal layer 2 on the top surfaces of the protruding portions 12. In a second method as shown in FIG. 10, an insulating portion 124 is provided and mounted on the top surface of each protruding portion 12, for isolating the corresponding portion of the metal layer 2 from the chip module 8. In a third method as shown in FIG. 9, a laser 5 is provided and focused on the top surface of each protruding portions 12 to perform burning, until the portions of the metal layer 2 located on the top surfaces of the protruding portions 12 are all burnt up. Preferably, before the burning of the laser 5, a protruding block 6 is provided on the top surface of each protruding portion 12 to allows the laser 5 to focus thereon. An area of the protruding block 6 is smaller than an area of the top surface of each protruding portion 12, and the protruding block 6 disappears after the burning of the laser 5, allowing the laser 5 to accurately focus on the top surfaces of the protruding blocks 6 conveniently.

FIG. 10 shows between an electrical connector 100 according to a second embodiment of the present invention. The difference between this embodiment and the electrical connector 100 according to the first embodiment exists in that, after plating of the metal layer 2 is completed, the metal layer 2 covers the top surfaces of the protruding portions 12, and a insulating portion 124' is further provided and mounted on the top surface of each protruding portion 12. Accordingly, the portions of the metal layer 2 located on the top surfaces of the protruding portions 12 do not need to be completely removed, and the metal layer 2 can be prevented from contacting with the chip module 8. Other structures of the embodiment are identical with those of the first embodiment, and details are not elaborated herein.

Figure 11:
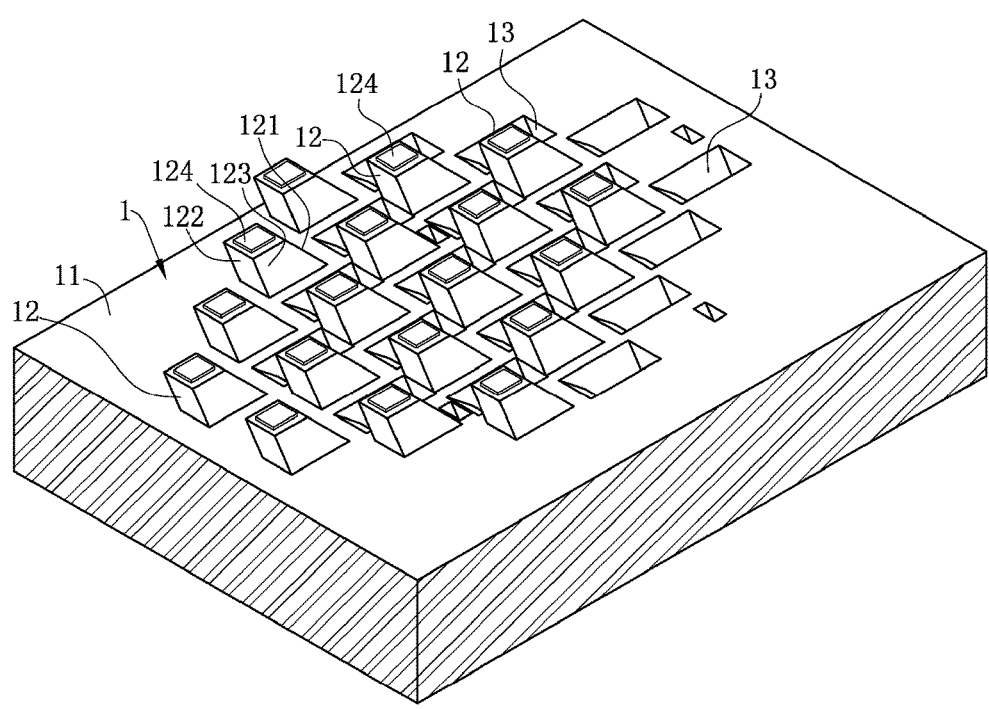
FIG. 11 is a perspective schematic view of an electrical connector according to a third embodiment of the present invention before a body thereof is plated with metal layers.

FIG. 11 shows between an electrical connector 100 according to a third embodiment of the present invention. The difference between this embodiment and the electrical connector 100 according to the first embodiment exists in that each protruding portion 12 is step-shaped having a smaller top and a larger bottom, thereby reducing the sizes of the top surfaces of the insulating portions 124. During plating of the metal layer 2, the portions of the metal layer 2 covering the top surfaces of the insulating portions 124 can be reduced, reducing the difficulty for removing the metal layer 2 from the top surfaces of the insulating portions 124. Other structures of the embodiment are identical with those of the first embodiment, and details are not elaborated herein.

Figure 12:
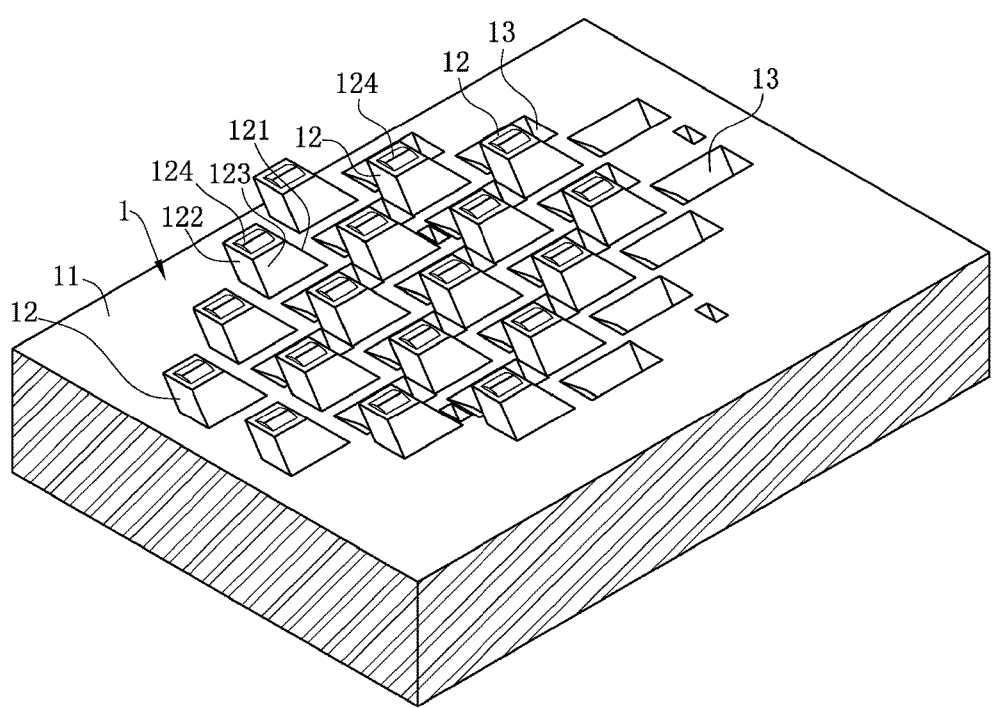
FIG. 12 is a perspective schematic view of an electrical connector according to a fourth embodiment of the present invention before a body thereof is plated with metal layers.

FIG. 12 shows between an electrical connector 100 according to a fourth embodiment of the present invention. The difference between this embodiment and the electrical connector 100 according to the third embodiment exists in that the top surface of each insulating portion 124 is an arc-shaped surface. Other structures of the embodiment are identical with those of the third embodiment, and details are not elaborated herein.

To sum up, the electrical connector 100 according to certain embodiments of the present invention has the following beneficial effects:

(1) The metal layer 2 covers the upper surface 11 and the peripheries of the protruding portions 12, and the insulating portions 124 are located on the protruding portions 12 for supporting the chip module 8, thus ensuring the metal layer 2 to better shield signal interference among the terminals 3, satisfying high-frequency signal transmission of the terminals 3, and avoiding the metal layer 2 from contacting with the chip module 8 and preventing the chip module 8 from short-circuiting.

(2) The second slots 132 penetrate through the upper surface 11, so that the metal layer 2 covers inner walls of the second slots 132, allowing the ground terminals 3B to be conductively connected with the metal layer 2, and enhancing a shielding function of the ground terminals 3B. The first slots 131 do not penetrate through the upper surface 11, so that the metal layer 2 does not cover inner walls of the first slots 131, thus preventing from short-circuiting between the signal terminals 3A and the metal layer 2.

(3) The acute angle formed between the first side surface 121 and the upper surface 11 is identical to an inclined angle of a top of the elastic portion 31 relative to the upper surface 11, and the acute angle formed between the second side surface 122 and the upper surface 11 is identical to an inclined angle of the fixing portion 32 relative to the upper surface 11. Thus, the inclination of the protruding portions 12, the elastic portions 31 and the fixing portions 32 are guaranteed to be consistent, and interference of the protruding portions 12 and the corresponding terminals 3 can be avoided.

(4) The first side surface 121 of each protruding portion 12 and an inner wall of a corresponding accommodating hole 13 are spaced apart, thus increasing a distance between the first side surface 121 and the corresponding elastic portion 31, preventing the elastic portion 31 from deforming downward and contacting with the first side surface 121 when the chip module 8 is mounted.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, configured to be electrically connected with a chip module, comprising:
    a body, provided with a plurality of accommodating holes, and having an upper surface;
    at least one protruding portion protruding upward from the upper surface, wherein an insulating portion is located on the at least one protruding portion to be in contact with the chip module upward;
    a metal layer covering the upper surface and a periphery of the at least one protruding portion and not covering the insulating portion, wherein the metal layer is located below a top surface of the insulating portion and is not in contact with the chip module, and a portion of the metal layer located on the periphery of the at least one protruding portion is higher than a portion of the metal layer located on the upper surface; and
    a plurality of terminals, accommodated in the accommodating holes and configured to be conductively connected with the chip module.

2. The electrical connector according to claim 1, wherein:
    each of the at least one protruding portion is provided with a first side surface, a second side surface, and two third side surfaces opposite to each other;
    the first side surface and the second side surface are oblique and configured to connect the two third side surfaces;
    each of the third side surfaces is perpendicular to the upper surface; and
    an acute angle formed between the first side surface and the upper surface is smaller than an acute angle formed between the second side surface and the upper surface.

3. The electrical connector according to claim 2, wherein each of the terminals has a fixing portion being oblique and configured to fix the terminal to the body, and an inclined angle of the fixing portion relative to the upper surface is identical to the acute angle formed between the second side surface and the upper surface.

4. The electrical connector according to claim 2, wherein the second side surface of each of the at least one protruding portion and an inner wall of a corresponding one of the accommodating holes are coplanar.

5. The electrical connector according to claim 2, wherein each of the terminals has an elastic portion being oblique and configured to abut the chip module, and an inclined angle of a top of the elastic portion relative to the upper surface is identical to the acute angle formed between the first side surface and the upper surface.

6. The electrical connector according to claim 2, wherein the first side surface of each of the at least one protruding portion and an inner wall of a corresponding one of the accommodating holes are spaced apart.

7. The electrical connector according to claim 1, wherein the insulating portion integrally extend from the at least one protruding portion.

8. The electrical connector according to claim 7, wherein each of the at least one protruding portion is step-shaped having a smaller top and a larger bottom, and the top surface of the insulating portion is a flat surface.

9. The electrical connector according to claim 7, wherein the top surface of the insulating portion is an arc-shaped surface.

10. The electrical connector according to claim 1, wherein the insulating portion is mounted on a top surface of the at least one protruding portion, and the metal layer covers the top surface of the at least one protruding portion.

11. The electrical connector according to claim 1, wherein:
    the terminals comprise a plurality of signal terminals and a plurality of ground terminals, and each of the signal terminals and the ground terminals has a fixing portion;
    the body has a plurality of first slots and a plurality of second slots;
    each of the first slots fixes the fixing portion of a corresponding one of the signal terminals and each of the second slots fixes the fixing portion of a corresponding one of the ground terminals;
    the second slots penetrate through the upper surface, so that the metal layer covers an inner wall of each of the second slots, and the fixing portion of each of the ground terminals is in contact with the metal layer; and
    the first slots do not penetrate through the upper surface, so that the metal layer does not cover inner walls of the first slots.

12. The electrical connector according to claim 1, wherein each of the terminals has an elastic portion being oblique toward a same side and configured to abut the chip module, and a fixing portion configured to fix the terminal;
    a beam is provided to connect the elastic portion and the fixing portion; and
    an inclined angle of the fixing portion and an inclined angle of the elastic portion are different.

13. The electrical connector according to claim 1, wherein the accommodating holes are arranged in a plurality of rows and columns, and each of the at least one protruding portion is located between two adjacent ones of accommodating holes along a row direction and a column direction.

14. A manufacturing method of an electrical connector, comprising:
    S1: providing a body having an upper surface, wherein at least one protruding portion protrudes upward from the upper surface and is configured to support a chip module;
    S2: providing a metal layer plated on the upper surface and all surfaces of the at least one protruding portion, wherein the metal layer is not in contact with the chip module;
    S3: insulating a top surface of the at least one protruding portion to provide an insulating portion located on the at least one protruding portion, wherein the insulating portion is in contact with the chip module upward, the metal layer is located below a top surface of the insulating portion, and the metal layer does not cover the insulating portion; and
    S4: assembling a plurality of terminals in the body.

15. The manufacturing method of the electrical connector according to claim 14, wherein the step of insulating the top surface of the at least one protruding portion comprises: inversely disposing the body in a chemical fluid, so that the top surface of the at least one protruding portion is immersed in the chemical fluid, until a portion of the metal layer located on the top surface of the at least one protruding portion is completely removed.

16. The manufacturing method of the electrical connector according to claim 14, wherein the step of insulating the top surface of the at least one protruding portion comprises: providing the insulating portion, mounted on the top surface of the at least one protruding portion.

17. The manufacturing method of the electrical connector according to claim 14, wherein the step of insulating the top surface of the at least one protruding portion comprises: focusing a laser on the top surface of the at least one protruding portion to perform burning, until a portion of the metal layer located on the top surface of the at least one protruding portion is completely burnt up.

18. The manufacturing method of the electrical connector according to claim 17, wherein before the burning of the laser, a protruding block is provided on the top surface of the at least one protruding portion to allow the laser to focus thereon, an area of the protruding block is smaller than an area of the top surface of the at least one protruding portion, and the protruding block disappears after the burning of the laser.

19. The manufacturing method of the electrical connector according to claim 14, wherein in the step S2, a metal fluid is poured onto the upper surface from top to bottom, so that the metal fluid freely diffuses on the upper surface until the upper surface is entirely covered, thereby plating the metal layer on the upper surface.

* * * * *